US006841833B2

(12) United States Patent
Hsu et al.

(10) Patent No.: US 6,841,833 B2
(45) Date of Patent: Jan. 11, 2005

(54) 1T1R RESISTIVE MEMORY

(75) Inventors: Sheng Teng Hsu, Camas, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 64 days.

(21) Appl. No.: 10/453,156

(22) Filed: Jun. 3, 2003

(65) Prior Publication Data

US 2004/0061180 A1 Apr. 1, 2004

Related U.S. Application Data

(63) Continuation-in-part of application No. 10/256,362, filed on Sep. 26, 2002, now Pat. No. 6,583,003.

(51) Int. Cl.[7] .......................... H01L 29/76; H01L 29/94; H01L 31/062; H01L 31/113; H01L 31/119
(52) U.S. Cl. ....................................... 257/379; 257/350
(58) Field of Search .................. 257/350, 379, 257/154, 169, 245, 364, 489

(56) References Cited

U.S. PATENT DOCUMENTS 3,838,405 A  9/1974  Arnett et al. ........... 340/173 R
6,204,139 B1  3/2001  Liu et al. .................... 438/385
6,473,332 B1  10/2002  Ignatiev et al. ............. 365/148

OTHER PUBLICATIONS

Harai, Masahiko "Ferromagnetic Memory and its Information Reproducing Method" JP2002140889A (abstract only) Japanese Abstract May 17, 2002.*

Article entitled, "Electric–pulse–induced reversible resistance change effect in magnetoresistive films", by S.Q. Liu et al., published in Applied Physics Letters, vol. 76, No. 19, 8 May 8, 2000, pp 2749–2751.

* cited by examiner

*Primary Examiner*—Craig A. Thompson
(74) *Attorney, Agent, or Firm*—Matthew D. Rabdau; David C. Ripma; Joseph P. Curtin

(57) ABSTRACT

A drain loaded 1T1R resistive memory device and 1T1R resistive memory array are provided. The resistive memory array comprises an array of drain loaded 1T1R resistive memory device structures. Word lines are connected across transistor gates, while a resistive elements are connected between transistor gates and bit lines. The resistive element comprises a material with a resistance that is changed electrically, for example using a sequence of electric pulses. The resistive element may comprise PCMO.

12 Claims, 4 Drawing Sheets

1T1R RESISTIVE MEMORY

CROSS-REFERENCE

This application is a continuation-in-part of U.S. patent application Ser. No. 10/256,362, filed on Sep. 26, 2002, now U.S. Pat. No. 6,583,003 entitled Method of Fabrication 1T1R Resistive Memory Array. The above-identified application is incorporated herein by reference.

BACKGROUND OF THE INVENTION

The present invention relates to information storage devices, and more specifically to a memory cell array incorporating a resistive memory element.

New materials, referred to herein as resistive memory materials, are now making it possible to produce non-volatile memory cells based on a change in resistance. Materials having a perovskite structure, among them colossal magnetoresistance (CMR) materials, are materials that have electrical resistance characteristics that can be changed by external influences.

For instance, the properties of materials having perovskite structures, especially CMR materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity, or the same polarity but with different pulse widths, from those used to induce the initial change.

SUMMARY OF THE INVENTION

Accordingly, a 1T1R resistive memory structure is provided. The resistive memory device structure comprises a substrate with a transistor formed thereon. The transistor comprises a gate, a source and a drain. A bottom electrode overlies the drain and is electrically connected to it. A resistive memory material overlies the bottom electrode and is electrically connected to the bottom electrode. A top electrode overlies the resistive memory material. The top electrode may be used to read out the value of the resistive memory material. The gate may be used to select the bit to read.

Individual 1T1R resistive memory structures may be combined to form a memory array. The top electrodes may act as bit lines. Word lines are electrically connected to the gates to select, or assist in selecting, one or more bits.

A resistive memory array is also provided. The array may comprise a word line connected to at least two transistor gates. Each transistor drain is connected to a bit line through a resistive memory element. Adjacent transistor sources may be connected together to a common source line. The source lines are connected to a source voltage, which may be ground. Multiple 1T1R resistive memory device structures may be arranged as an array, whereby multiple drains can share a bit line. Word lines connected to gates may then be used to select multiple bits within a single word, such that one or more bits may be read or written.

DETAILED DESCRIPTION OF THE INVENTION

Figure 1:
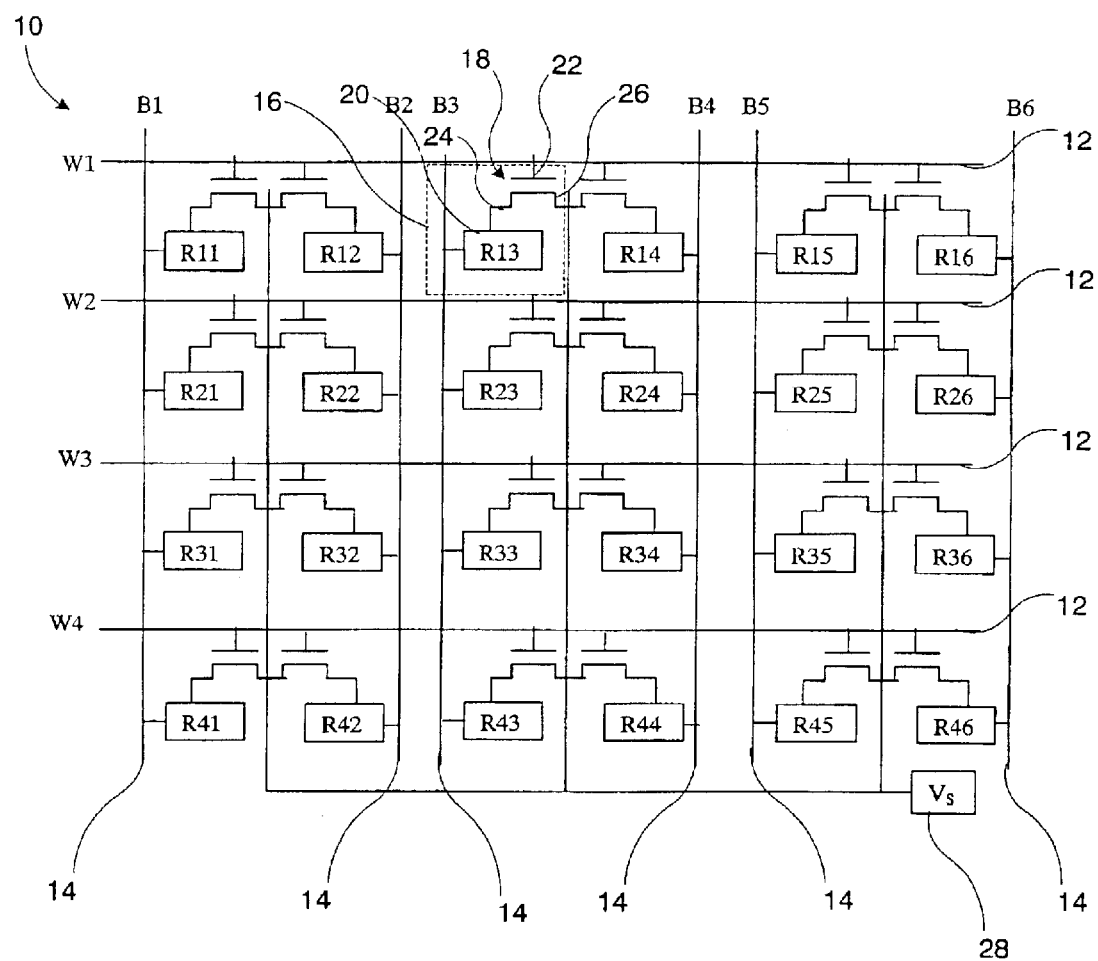
FIG. 1 is a schematic view of a resistive memory array.

FIG. 1 illustrates a schematic view of an embodiment of a 1T1R memory array 10. A 24 bit 1T1R memory array is shown. As shown, there are four word lines 12, labeled W1–W4, and six bit lines 14, labeled B1–B6. Each bit 16 (indicated by dashed lines) is formed by a transistor 18 and a resistive element 20, accordingly this memory element may be referred to as a 1-transistor, 1-resistor memory bit, or a 1T1R memory bit. Each transistor 18 has a gate 22, which is connected to one of the word lines 12. The resistive element 20 is connected between a drain 24 of a transistor 18 and a bit line 14. The transistor 18 has a source 26 connected to a common source 28 (designated Vs). As shown in this embodiment, the sources 26 of adjacent transistors 18 are connected together, which may reduce array area.

Figure 2:
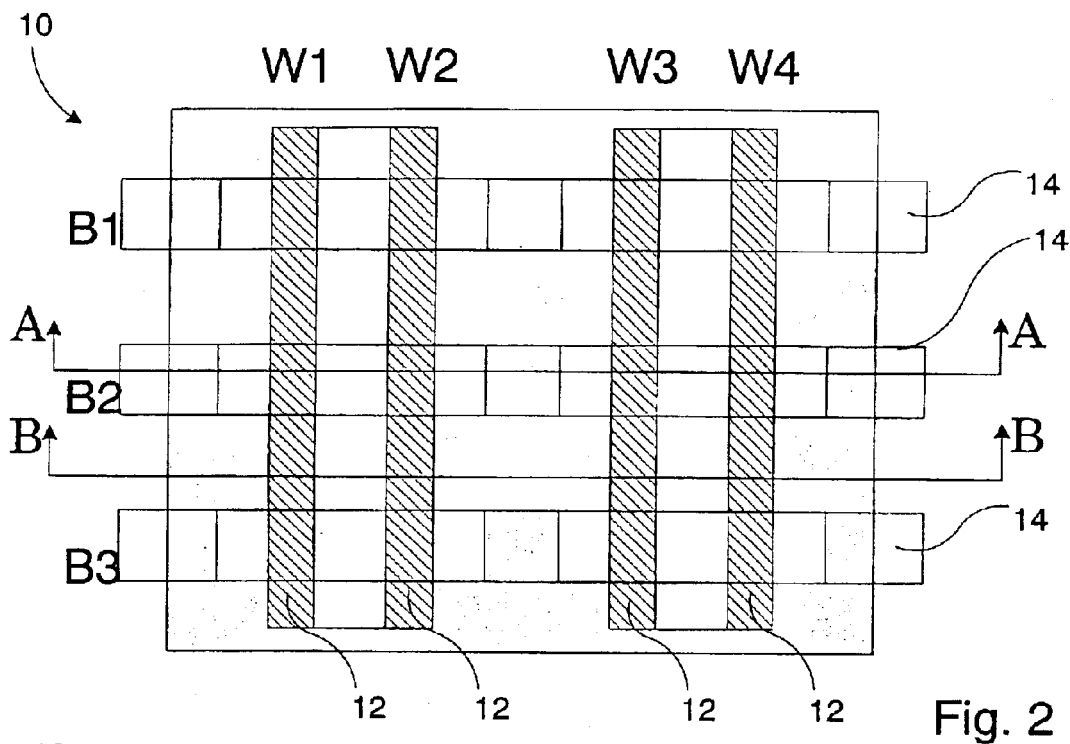
FIG. 2 is a planar view of a resistive memory array.

FIG. 2 illustrates a planar view of a 1T1R memory array 10 during processing. As shown in this embodiment, there are four word lines 12, labeled W1–W4, and three bit lines 14, labeled B1–B3, which form a 12 bit memory array.

Figure 3:
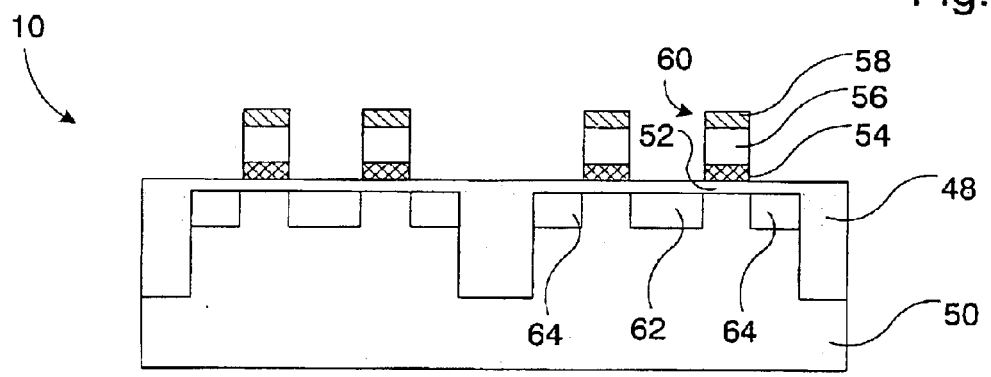
FIG. 3 is a cross-sectional view of the resistive memory array taken through a bit line.
Figure 4:
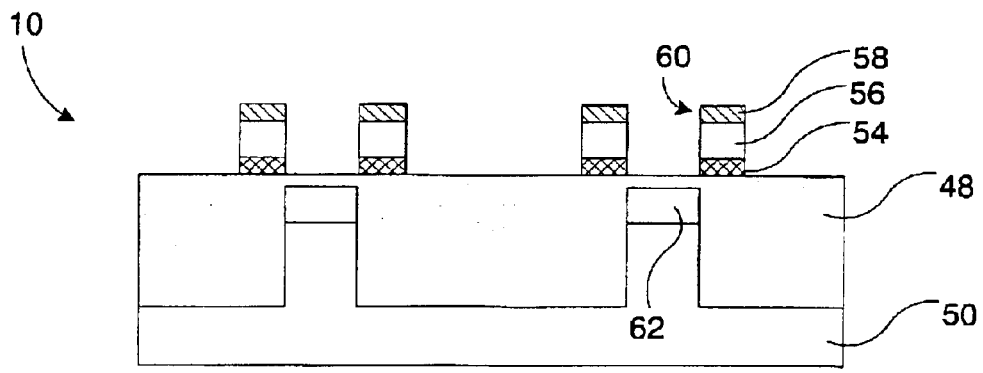
FIG. 4 is a cross-sectional view of the resistive memory array taken from between adjacent bit lines.

FIG. 3 shows a cross-section of the memory array of FIG. 2 taken through one of the bit lines 14, and corresponds to the cross-section identified as "A—A" in FIG. 2. FIG. 4 shows a cross-section that corresponds to "B—B" in FIG. 2, which is a cross-section taken between two adjacent bit lines 14. A standard process, which is well known to those of ordinary skill in the art, may be used to form any desired wells and shallow trench isolation (STI) 48 on a substrate 50. A gate oxide 52 is grown over the substrate 50. A layer of polycide 54 is deposited, followed by a layer of oxide 56, and a layer of nitride 58. The term oxide as used herein refers to silicon oxide, including silicon dioxide. The term nitride refers generally to silicon nitride. For example, the polycide 54 may be between approximately 100 nm and 200 nm thick; the oxide 56 may be between approximately 100 nm and 200 nm thick, and the nitride between approximately 50 nm and 100 nm thick. Photoresist is deposited and patterned. The layers of polycide 54, oxide 56 and nitride 58 are then etched to form gate stacks 60, as shown in FIG. 3 and FIG. 4. Phosphorous or arsenic N+ source/drain ion implantation is then performed to produce source regions 62 and drain regions 64. The N+ ion implantation may include lightly doped drain (LDD). The N+ ion implantation may include Halo ion implantation. Both of these implantation processes may be used in connection with support circuitry, if any, so that these processes performed in connection with the memory array need not add process steps to the total process.

Figure 5:
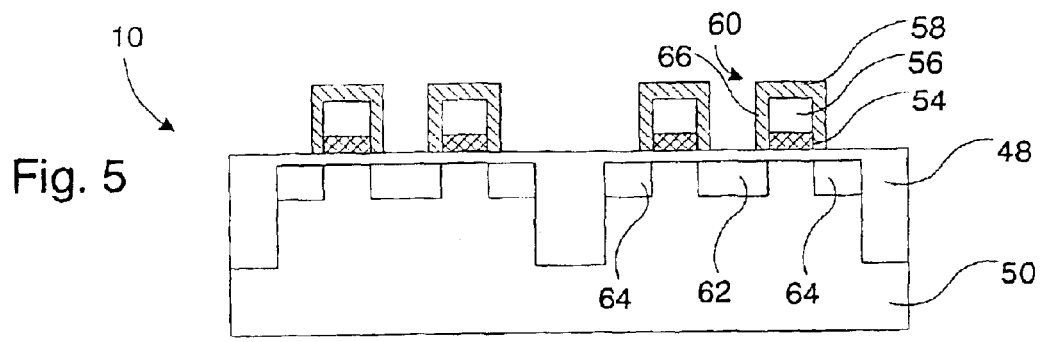
FIG. 5 is a cross-sectional view of the resistive memory array taken through a bit line.
Figure 6:
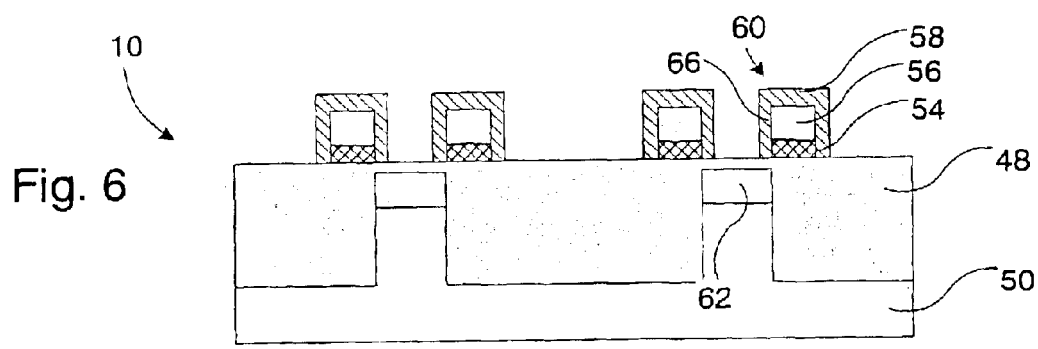
FIG. 6 is a cross-sectional view of the resistive memory array taken from between adjacent bit lines.

A layer of nitride is deposited, preferably to a thickness of between approximately 50 nm and 150 nm, and etched to form nitride sidewalls 66, as shown in FIGS. 5 and 6. FIG. 5 corresponds to FIG. 3 following formation of the nitride sidewalls 66. FIG. 6 corresponds to FIG. 4 following formation of the nitride sidewalls 66. A salicide process is then performed to salicide the N+ areas, which correspond to the source/drain regions 62 and 64, and the P+ areas, which within the memory array correspond to the p-well tie (not shown). The salicide process may be used to form common source lines, for example between adjacent transistors. If the memory array is being formed simultaneously with support circuitry the P+ areas may also correspond to source/drain regions of some of the support circuitry (not shown).

Figure 7:
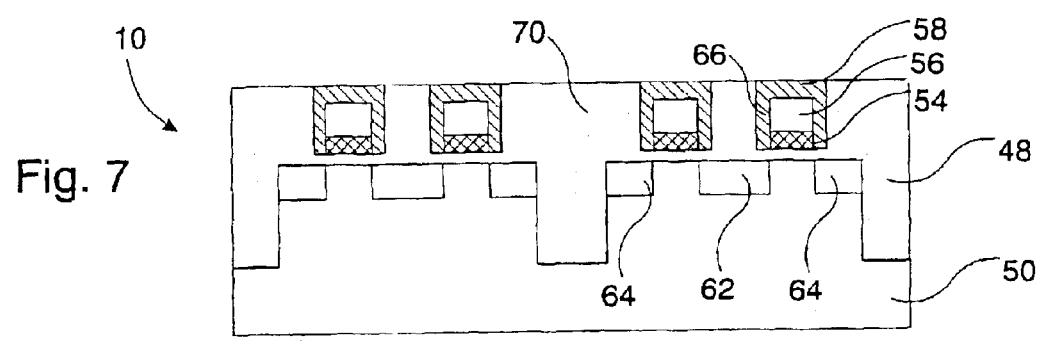
FIG. 7 is a cross-sectional view of the resistive memory array taken through a bit line.
Figure 8:
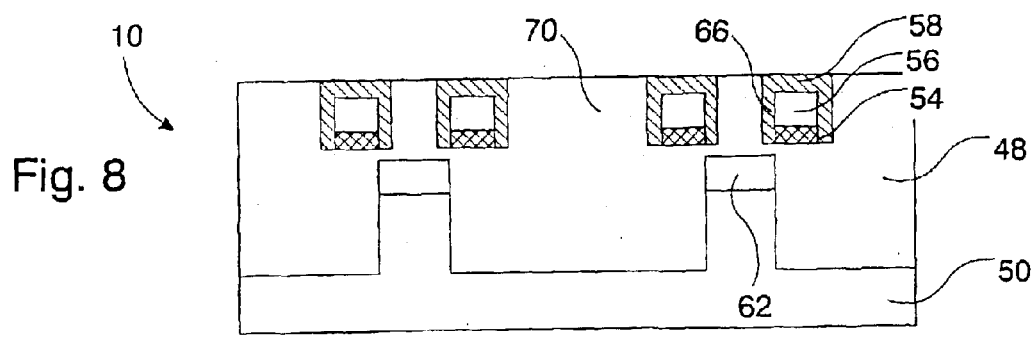
FIG. 8 is a cross-sectional view of the resistive memory array taken from between adjacent bit lines.

Silicon oxide 70 is deposited by a CVD process to a thickness suitable for planarization using a CMP process. For example, the silicon oxide may be deposited to a thickness of about 1.5 times the height of the gate stack 60. The silicon oxide 70 is then planarized using a CMP process. In one embodiment the planarization will be stopped at the nitride 58, resulting in the structure shown in FIG. 7, which corresponds to FIG. 5 following deposition and planarization of silicon oxide 70, and FIG. 8, which likewise corresponds to FIG. 6 following additional processing.

Figure 9:
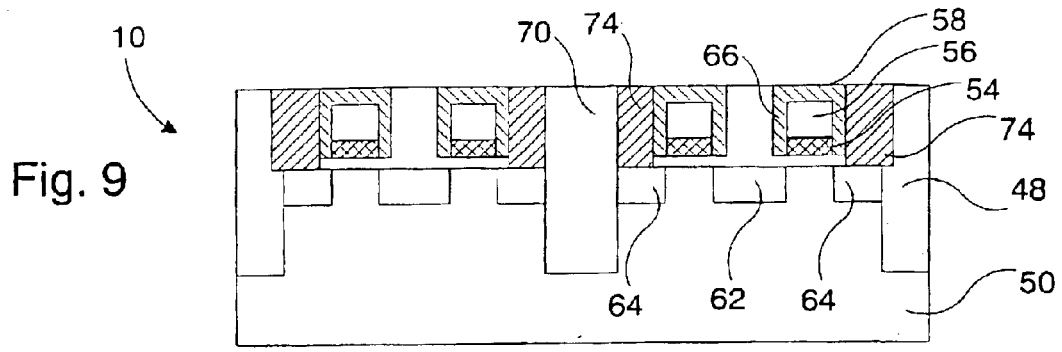
FIG. 9 is a cross-sectional view of the resistive memory array taken through a bit line.
Figure 10:
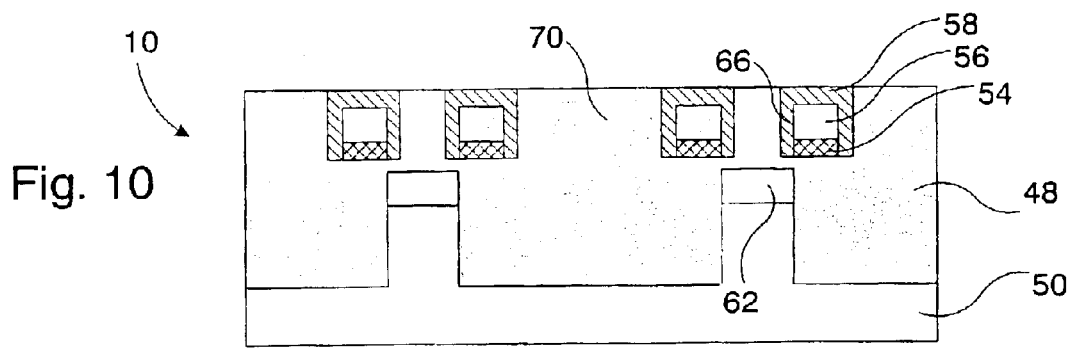
FIG. 10 is a cross-sectional view of the resistive memory array taken from between adjacent bit lines.

Photoresist is applied and patterned for bit contact etch. A selective etch of the oxide is used to open bit contacts. Because of the high selectivity of oxide to nitride etch, overlap of the mask pattern over the nitride 58 is tolerable. Due to the selectivity of the etch process the silicon oxide is etched without etching the nitride on top of the gate stack, this provides at least some self alignment of the bit contacts. A barrier metal, such as, TiN, TaN, TaAlN$_x$ is deposited to form a thin barrier layer (not shown). A bottom electrode material is then deposited. For example the bottom electrode material may be platinum or iridium. The bottom electrode material is planarized, for example using CMP, to the level of the nitride 58 to produce bottom electrodes 74. The resulting structure is shown in FIG. 9, which corresponds to the cross-section at the bit line, and FIG. 10, which corresponds to the cross-section between adjacent bit lines.

Figure 11:
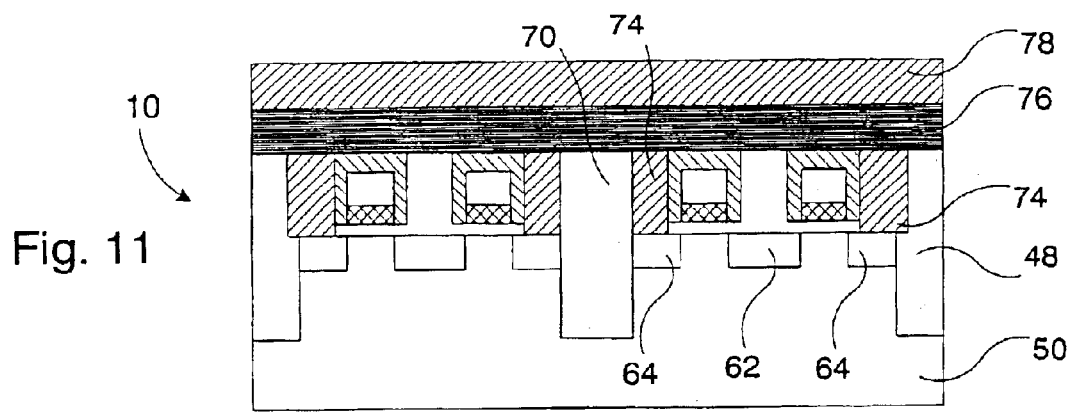
FIG. 11 is a cross-sectional view of the resistive memory array taken through a bit line.
Figure 12:
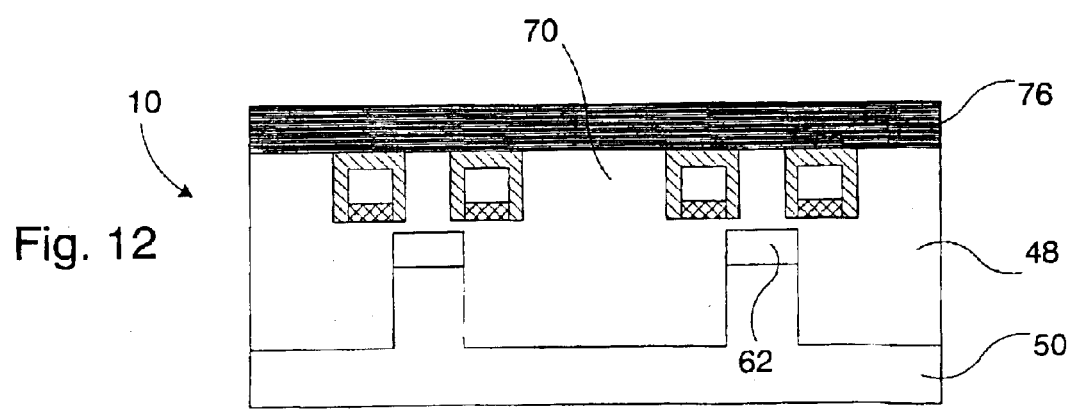
FIG. 12 is a cross-sectional view of the resistive memory array taken from between adjacent bit lines.

In one embodiment, a resistive memory material 76 is deposited over the bottom electrodes 74 across the memory array 10. Alternatively, the resistive memory material 76 is deposited over an entire wafer and removed from areas outside the memory array 10. The resistive memory material 76 is composed of any material that is capable of changing resistance in response to electrical pulses, for example a CMR and HTSC materials, such as PCMO. A top electrode 78 is then formed by depositing a top electrode material, such as platinum or iridium, patterning and etching the top electrode material to form one, or more, top electrodes 78, which correspond to the bit lines 14. The resulting memory array structure is illustrated by the cross-sectional view shown in FIG. 11, which corresponds to the cross section at a bit line, and FIG. 12, which corresponds to the cross section between adjacent bit lines.

In a second embodiment, a layer of resistive memory material 76 is deposited overlying the memory array and etched to form resistive memory studs (not shown) overlying the bottom electrodes 74. A thin layer of between approximately 10 and 50 nm of a barrier insulator, such as $Si_3N_4$, $Al_3O_5$ or $TiO_2$ is deposited, followed by a layer of oxide. The layer of oxide has a thickness suitable for CMP planarization, for example 1.5 times the height of the resistive memory studs. The layer of oxide is then planarized level with the resistive memory studs, possibly using CMP. The planarization process removes the barrier insulator from the tops of the resistive memory studs, prior to formation of the top electrodes 78.

In a third embodiment, resistive memory studs are formed using a single Damascene process. A layer of oxide is deposited to a thickness of between approximately 100 nm and 300 nm. Trenches are etched through the oxide to the bottom electrodes 74. A thin layer of barrier insulator, such as $Si_3N_4$, $Al_3O_5$ or $TiO_2$, between approximately 10 nm and 50 nm thick is deposited along the trenches, including on trench sidewalls. The barrier insulator is plasma etched to remove barrier insulator from planar surfaces, including the bottom electrodes 74, leaving barrier insulator on the trench sidewalls. The resistive memory material 76 is deposited and planarized to form resistive memory studs (not shown). Top electrodes 78 are then formed overlying the resistive memory studs.

Although the above embodiment, utilized an N+ ion implant for the formation of the source and drain regions, a P+ ion implant could have been used instead.

One process of forming transistors has been described in connection with the formation of the 1T1R resistive memory array. This process may be used to form support electronics as well as the memory array. For example, the support electronics and the memory array transistors may be formed using at least some of the process steps described above. An alternative process for forming transistors may be used, including for example a process that incorporates a high-k dielectric material. Once the transistors are formed, contact is made to the drain and a resistive memory material is deposited, as described above to form a 1T1R resistive memory array.

A 1T1R resistive memory device structure along with a memory array comprising multiple 1T1R bits has been provided, and described. The present invention is not limited to any particular array size or configuration. Other variations and embodiments of the invention may occur to those of ordinary skill in the art. The scope of the invention shall be defined by the claims, without being limited by any preferred embodiment.

What is claimed is:

1. A resistive memory array structure comprising:
   a) a first transistor comprising a first gate, a first source and a first drain;
   b) a second transistor comprising a second gate, a second source and a second drain;
   c) a first word line electrically connected to the first gate and the second gate;
   d) a source line electrically connected to the first source and the second source;
   e) a first resistive element electrically connected between the first drain and a first bit line; and
   f) a second resistive element electrically connected between the second drain and a second bit line.

2. The resistive memory array of claim 1, wherein the first resistive element comprises a material with resistive properties that can be changed in response to electrical pulses.

3. The resistive memory array of claim 2, wherein the first resistive element comprises PCMO.

4. The resistive memory array of claim 1, wherein the source is electrically connected to a source voltage.

5. The resistive memory array of claim 4, wherein the source voltage is ground.

6. The resistive memory array of claim 1, further comprising:
   a) a third transistor, comprising a third gate, a third source and a third drain;
   b) a fourth transistor, comprising a fourth gate, a fourth source and a fourth drain;
   c) a second word line electrically connected to the third gate and the fourth gate;
   d) a third restive element electrically connected between the third drain and the first bit line;
   e) a fourth resistive element electrically connected between the fourth drain and the first bit line; and
   f) wherein, the third source and the fourth source are electrically connected to the source line.

7. A resistive memory device structure comprising:
   a) a substrate;
   b) a transistor comprising a gate, a source and a drain formed on the substrate;
   c) a bottom electrode overlying and electrically connected to the drain;
   d) a resistive memory material overlying and electrically connected to the bottom electrode; and
   e) a top electrode overlying and electrically connected to the resistive memory material.

8. The device structure of claim 7, wherein the bottom electrode is platinum or iridium.

9. The device structure of claim 8, further comprising a barrier metal interposed between the bottom electrode and the drain.

10. The device structure of claim 9, wherein the barrier metal is TiN, TaN, or TaAlN.

11. The device structure of claim 7, wherein the resistive memory material is a CMR material.

12. The device structure of claim 7, wherein the resistive memory material is PCMO.

* * * * *